United States Patent [19]

Van de Lagemaat

[11] Patent Number: 5,068,604
[45] Date of Patent: Nov. 26, 1991

[54] METHOD OF AND DEVICE FOR TESTING MULTIPLE POWER SUPPLY CONNECTIONS OF AN INTEGRATED CIRCUIT ON A PRINTED CIRCUIT BOARD

[75] Inventor: Dirk Van de Lagemaat, Hilversum, Netherlands

[73] Assignee: U.S. Philips Corporation, New York, N.Y.

[21] Appl. No.: 368,748

[22] Filed: Jun. 20, 1989

[30] Foreign Application Priority Data

Jul. 20, 1988 [NL] Netherlands ................. 8801835

[51] Int. Cl.⁵ ................. G01R 31/00; G01R 31/02
[52] U.S. Cl. ................. 324/158 R; 324/158 F; 324/158 T; 371/15.1
[58] Field of Search ....... 324/158 R, 158 T, 158 MG, 324/158 F, 537; 371/15.1, 68.1; 364/483

[56] References Cited

U.S. PATENT DOCUMENTS

| | | | |
|---|---|---|---|
| 3,518,779 | 7/1970 | Cox et al. | 324/158 R |
| 3,763,430 | 10/1973 | Terrey | 324/537 |
| 4,142,151 | 2/1979 | Hansen | 324/537 |
| 4,333,049 | 6/1982 | Yui et al. | 324/158 R |
| 4,472,679 | 9/1984 | Smith | 324/158 F |
| 4,661,772 | 4/1987 | Kirstein | 324/158 R |
| 4,719,418 | 1/1988 | Flaker et al. | 324/158 R |
| 4,744,061 | 5/1988 | Takamae et al. | 371/68.1 |
| 4,791,358 | 12/1988 | Sanerwald et al. | |
| 4,825,151 | 4/1989 | Aspelin | 324/158 R |
| 4,843,608 | 6/1989 | Fu et al. | 371/68.1 |
| 4,853,626 | 8/1989 | Resler | 324/158 R |
| 4,875,006 | 10/1989 | Henley et al. | 324/158 R |
| 4,894,605 | 1/1990 | Ringleb et al. | 324/158 R |

Primary Examiner—Kenneth A. Wieder
Assistant Examiner—William J. Burns
Attorney, Agent, or Firm—Bernard Franzblau

[57] ABSTRACT

A test organization for testing the correct operation of multiple power supply connections for the same rated supply voltage of an integrated circuit. The integrated circuit is provided with a test comparison circuit which is capable of measuring a voltage difference, if any, by way of respective test leads. Should one of the power supply connections no longer be correctly connected, the voltage difference increases beyond a threshold value high and is indicated by way of an error signal produced by the test comparison circuit.

22 Claims, 2 Drawing Sheets

METHOD OF AND DEVICE FOR TESTING MULTIPLE POWER SUPPLY CONNECTIONS OF AN INTEGRATED CIRCUIT ON A PRINTED CIRCUIT BOARD

BACKGROUND OF THE INVENTION

This invention relates to a method of testing multiple power supply connections of an integrated circuit on a printed circuit board. Various large scale integrated circuits are constructed to have multiple power supply connections for the same rated supply voltage. The number of power supply connections thus exceeds the number of supply voltages. For example, the Motorola MC 68010 dual-in-line package microprocessor comprises four power supply connections, that is to say two for VCC and two for ground potential, GND. The two types of power supply connections are present in triple form in the square chip carrier version. The integrated digital circuit 80386 by INTEL CORPORATION has a 20-fold power supply connection VCC and even 21-fold VSS connection. This multiplicity makes possible a higher clock frequency because the power supply connections then represent a lower current resistance or lower inductance. On the integrated circuit itself there are two possibilities for power supply connections for the same rated supply voltage: they may be interconnected, for example, by means of a conductor track of aluminium or polysilicon. Alternatively, they are not interconnected. When the number is larger than two, both possibilities may be realized in a single circuit. The above circuits are mentioned merely by way of example. The described problem and its solution can in principle also be relevant to circuits for processing analog signals. In any case, the integration technology (bipolar, MOS, etc.) is irrelevant to a high degree.

SUMMARY OF THE INVENTION

An integrated circuit which is mounted on and connected to a printed circuit board can operate correctly at the highest permissble clock frequency and the lowest/highest permissible temperature only if all power supply connections are suitably connected to conductor tracks on the printed circuit board. In standard operating conditions the circuit will operate correctly in many cases, notably when the power supply connections on the substrate of the integrated circuit are interconnected. It is, inter alia, an object of the invention to perform, without intervening in the function of the integrated circuit, a simple test in the core of the circuit in order to test the functional presence of all power supply connections, without a so-called functional test being required, testing being performed as regards complete absence of the power supply connection as well as regards many categories of faults in the power supply connections, for example, soldering defects, interrupted leads and others. To achieve this, in accordance with one of the aspects of the invention, an on-chip test comparison circuit is connected between respective power supply connections for the same rated supply voltage by means of respective test leads in order to detect a standard voltage difference in a test state in the case of correct functioning of said power supply connections, and to generate an error signal in the case of a critical deviation from said voltage difference across the test leads. The test state is realized in that the integrated circuit has a comparatively high current consumption. This means that no standby state is assumed.

The invention also relates to a device for performing the method, and notably to a printed circuit board provided with an integrated circuit comprising test means for performing said test. The invention also relates to an integrated circuit comprising test means for performing said test.

Further attractive aspects of the invention are described in the dependent Claims.

BRIEF DESCRIPTION OF THE DRAWINGS

The invention will be described in detail hereinafter with reference to the accompanying drawing, in which.

DESCRIPTION OF THE PREFERRED EMBODIMENTS

Figure 1:
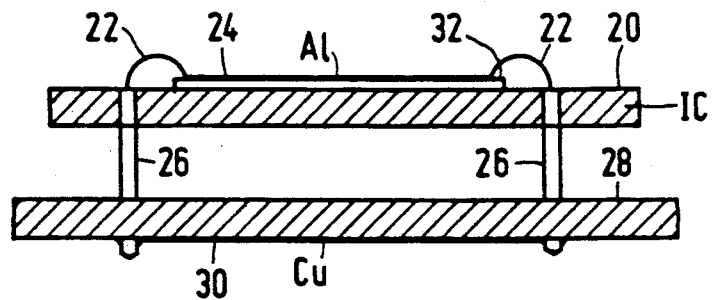
FIG. 1 diagrammatically shows a printed circuit board with an integrated circuit mounted thereon.

FIG. 1 diagrammatically shows a printed circuit board with an integrated circuit mounted thereon. Reference numeral 20 partly symbolically denotes the package, for example, a plastics DIL package. This package comprises connection pins 26. The pins are mounted, for example, by soldering, on printed circuit board 28. The actual integrated circuit is symbolized by element 32. It is assumed that the two connection pins shown are intended for the same rated supply voltage. This may be an arbitrary voltage per se (a positive voltage, a negative voltage or ground potential), the value of the supply voltage also being arbitrary. On the printed circuit board the connection pins are interconnected by way of a copper connection in the form of a track 30. Various technologies are feasible in this respect. The resistance of such a connection is in the range of from 5 to 25 mOhms. The pins 26 are both connected to a track 24 by way of bond wires 22. This track can be realized in aluminium using one type of technology or another. The width/length ratio of such a track is in the order of magnitude $W/L \approx 1/50 = 0.02$. The sheet resistance of aluminium generally amounts to approximately 60 mOhms per square. This means a resistance in the order of magnitude of 3 Ohms for the track. In other cases this track may consist completely or partly of polysilicon. This results in an even higher track resistance. In given cases the track will be interrupted or be absent, deliberately or not. This results in a resistance between the bond wires 22 as realized by the integrated circuit separately, which may be infinitely high in theory. In practice the resistance is limited by leakage resistances on the substrate and possibly by input and output resistances of functional parts of the integrated circuit. The physical realization of the integrated circuit and the mounting on the panel 28 can be realized in various ways. Surface mounted (SMD) components, mounting by way of so-called piggy-back facilities, and other versions are also feasible. The multiple power supply connections may be provided for 1, 2, 3 or more rated supply voltages. In addition to electrically conductive connections there may also be provided, for example, optical and also capacitive or inductive connections for signals.

Figure 2:
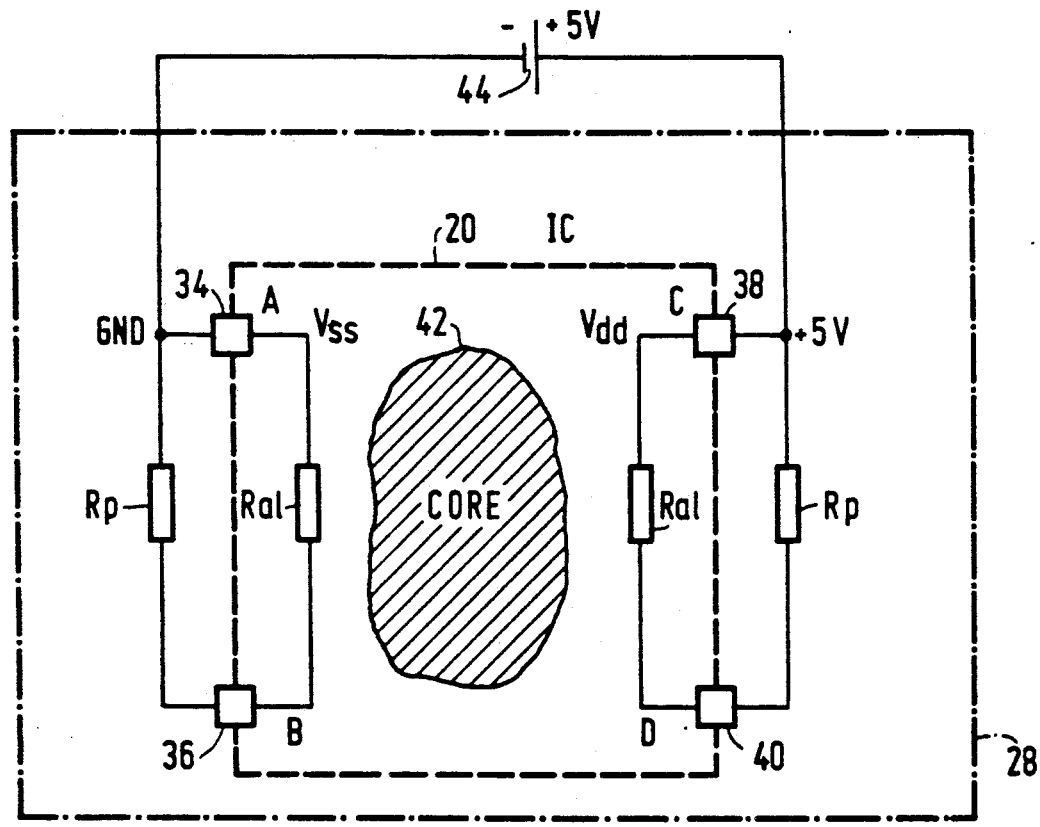
FIG. 2 shows an electrical equivalent diagram of the integrated circuit and printed circuit board.

FIG. 2 shows an electrical equivalent diagram of the integrated circuit and printed circuit board. On the printed circuit board 28 there is provided an integrated circuit 20 by way of two pins 34, 36 for the substrate voltage $V_{SS}$ and two pins 38, 40 for the voltage $V_{DD}$, being 5 V in this case. The equivalent resistances on the printed circuit board are represented by the reference Rp, and those on the integrated circuit itself by the reference Ral. The functional part of the integrated circuit is diagrammatically represented by a "core" 42 which is powered by said two voltages via connections which have been omitted for the sake of simplicity. The realization of this power supply on the integrated circuit and further connections of the integrated circuit to the environment have been omitted. There is also shown a power supply source (44). This source may be provided on the printed circuit board or not. The nature of the power supply is irrelevant to the invention (i.e. mains supply, battery, solar cell, inductive power supply, etc.).

Figure 3:
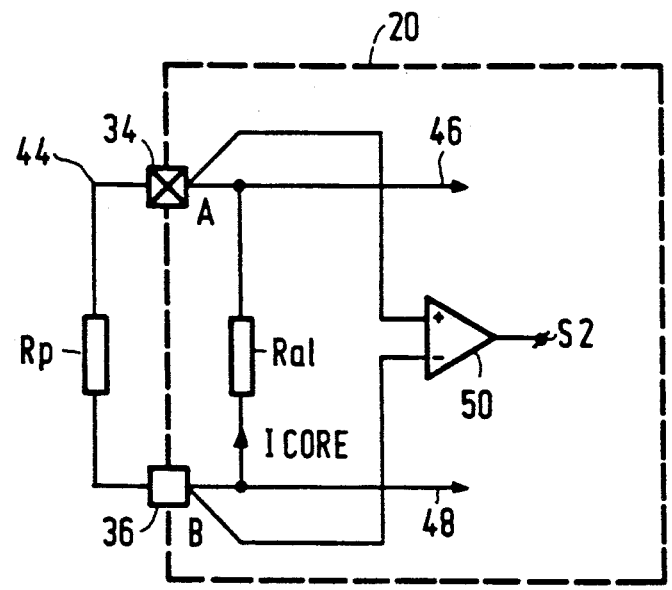
FIG. 3 shows an electrical equivalent diagram of an application of the invention.

FIG. 3 shows an electrical equivalent diagram of a part of FIG. 2 when the invention is used. The connections 34, 36 are shown, and also the equivalent resistances Rp, Ral, the connection to the power supply source 44, and the connections to the functional core of the function 46, 48. There is also shown a comparison circuit 50. When both power supply connections function correctly, the pins A, B will generally carry substantially the same current, for example, 50 mA. In that case the difference between these currents amounts to only a fraction of the current itself, for example 10%. In such cases the voltage drop across the resistance Ral (3 Ohms) amounts to no more than a fraction of 150 mV, being the voltage drop which would occur if said 50 mA current were to flow entirely through the 3-Ohm resistor. In this case the voltage drop probably amounts to some 15 mV. Should one of the two power supply pins not function correctly, this voltage drop becomes +150 mV or −150 mV, depending on which power supply pin is defective. It is assumed that the internal resistance of the functional part 42 in FIG. 2 is comparatively high so that the overall current remains the same. When the resistor Ral is made of polysilicon, the voltage difference may be higher in the case of an incorrectly operating power supply connection. This also holds when the connection is actually non-existent (Rp infinitely high). In that case the voltage difference detected by the comparison circuit may be higher, for example, as high as at most $V_{dd}$.

The comparison device 50 may be constructed, for example, in the same technology as the remainder of the integrated circuit, as a sense amplifier as customarily connected to a data output of a memory (for example, a RAM). Preferably, such a comparison device must be capable of detecting positive as well as negative difference voltages and it preferably has a threshold voltage. This threshold voltage is proportioned as a function of the intended current decrease per power supply connection. For example, it amounts to 75 mV in the above case. For other values of the normal current the threshold voltage is proportionally higher or lower. The comparison circuit 50 comprises an output 52 for applying an error signal to a processing circuit which is not shown for the sake of simplicity. In a simple version this error signal consists of one bit indicating "correct" versus "incorrect". It may be multivalent in order to indicate which of the power supply connections does not function correctly. In the case of two power supply connections it may comprise a series of two bits, for example, encoded as: 01-first connection faulty; 10-second connection faulty; 00-both connections correct. In that case the comparison device 50 may comprise, for example, two parallel outputs for simultaneously producing these signals. The possibility that both power supply connections are faulty is ignored. The processing circuit may form part of the integrated circuit itself or may be provided separately. An attractive solution consists in that, after discrimination to 1 bit or to 2 bits as described above, the output signal of the comparison circuit 50 is stored directly in a flip-flop, as will be described hereinafter.

Figure 4:
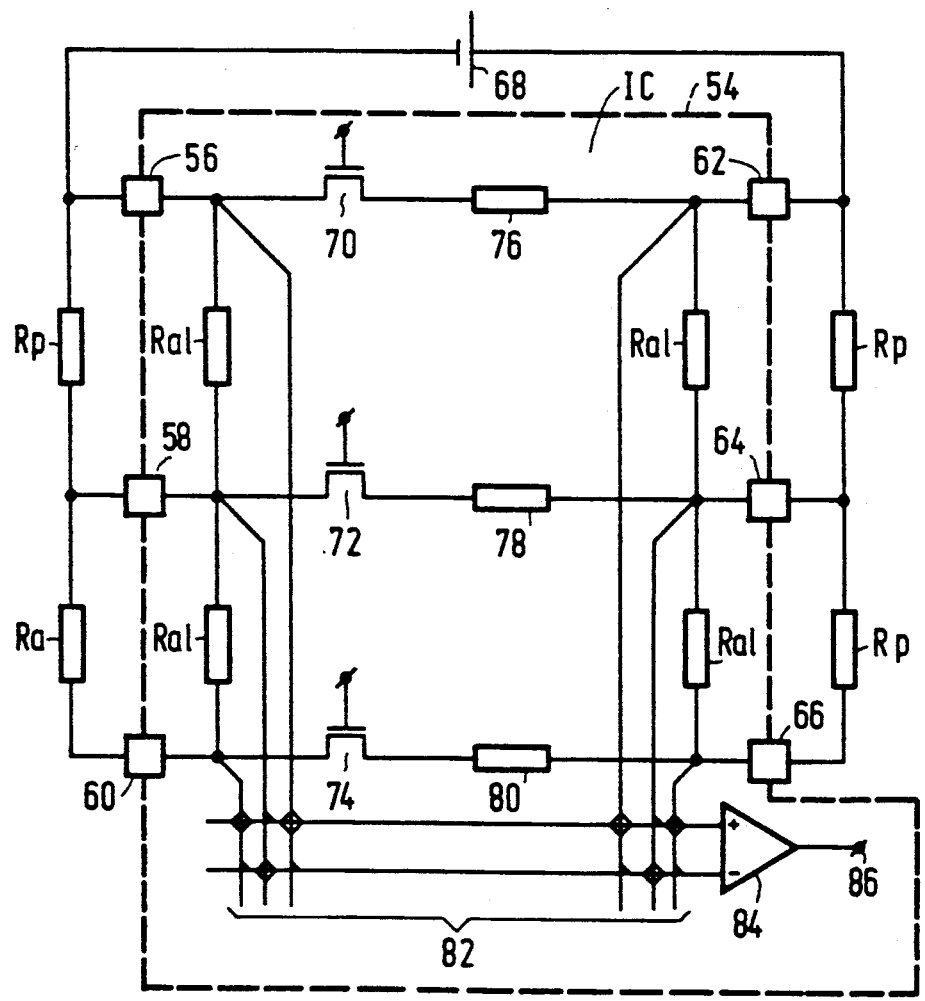
FIG. 4 shows an electrical equivalent diagram of a more elaborate embodiment of the invention.

FIG. 4 shows an electrical equivalent diagram of a more elaborate application of the invention. In this case the integrated circuit comprises three power supply connections 56, 58, 60 for a first power supply voltage and three power supply connections 62, 64, 66 for a second power supply voltage. The power supply source 68 is again shown in the form of a battery. Between the power supply connections the resistances Rp and Ral are again shown. In practice the resistances, for example Rp, will not always have the same value. The equivalent diagram may also be a more complex network. It is essential that the equivalent value of this network between two power supply connections is sufficiently high. The circuit also comprises three switching transistors 70, 72, 74, with respective series resistances 76, 78, 80. There are as many branches as there are pairs of power supply connections. In another set-up, the three branches need not be arranged in parallel. More branches may be involved so long as they always allow for a single power supply connection to be reached directly from the functional part of the integrated circuit, whereas the other power supply connections for the same rated supply voltage are reached only via a resistance Ral. In the present case the functional part has been omitted for the sake of simplicity. It may be connected in an arbitrary manner between the power supply connections 56 . . . 66. For each power supply connection the switching transistors realize a selectively activatable near-shortcircuit which is limited only by the series resistance.

Assume that the transistor 70 is turned on and the other two transistors 72, 74 are turned off. In that case in principle six voltage differences (three for each supply voltage) are to be compared with a standard. In order to facilitate the selection therebetween, there is provided a switching matrix 82 which comprises at its switchpoints a number of transistors which can be turned on. For a simple setup there are provided only those transistors which are denoted by lozenges. The resultant configuration is capable of making a decision between correct functioning and incorrect functioning. When all transistors which can be turned on (also the transistors which are denoted by a delta) are present, all faulty power supply connections can be detected and localized. Moreover, in that case for each drive configuration the comparison circuit 84 need supply only one bit value, because there also exists a commutation facility. For the sake of simplicity, the control of the switches 70 . . . 74 and the switching matrix 82 has been omitted in the Figure.

The control of the various switches and the storage of the results can be realized by way of flip-flops. These flip-flops may be included in a shift register chain suitable for performing a so-called boundary scan as described in Netherlands Patent Application 8502476, corresponding to U.S. Pat. No. 4,791,358 (12/13/88). The interconnection function described therein also offers the necessary hardware components for performing tests on other, internal parts of the circuit. Instead of test patterns, in accordance with the present Patent Application, control patterns are serially applied, and the resultant patterns (1=incorrect, 0=correct) are subsequently serially supplied to a test evaluator. An additional advantage of the above method consists in that it enables direct diagnoses of errors which would otherwise be impossible to detect or only with great difficulty. The boundary test scan is suitable for testing all IC pins. The additional logic circuitry can be provided at the edge of the integrated circuit or underneath the power supply tracks.

I claim:

1. An integrated circuit chip comprising: multiple power supply connections for at least two different supply voltages with at least two separate ones of said power supply connections carrying the same rated supply voltage, an on-chip test comparison circuit having input terminals coupled to respective test leads, a selection mechanism coupled between the supply connections and the test comparison circuit via said respective test leads in order to selectively and sequentially connect only power supply connections associated with the same supply voltage to respective input terminals of the test comparison circuit thereby to produce, in a test state of the integrated circuit an error signal on a signal output of the test comparison circuit when a voltage deviation from a standard voltage difference across said power supply connections exceeds a critical value.

2. An integrated circuit as claimed in claim 1 wherein said selection mechanism comprises a commutation mechanism for inverting the selection of two power supply connections for input terminals of the test comparison circuit.

3. An integrated circuit chip comprising: at least two separate power supply connections which carry the same rated supply voltage, means connecting said power supply connections, via respective test leads, to respective input terminals of an on-chip test comparison circuit in order to produce, in a test state of the integrated circuit, an error signal on a signal output of the test comparison circuit when a voltage deviation from a standard voltage difference across said power supply connections exceeds a critical value, and a data flip-flop which is fed by the output of the test comparison circuit in order to output a result bit for external evaluation by including the flip-flop in a serial shift register.

4. An integrated circuit as claimed in claim 3 further comprising a second data flip-flop for the storage of a control bit for selecting said test leads and for receiving, by including the second data flip-flop in a serial shift register, a control bit from an external control device.

5. A method of testing multiple separate power supply connections of an integrated circuit chip at least two of which connections are directly connected together via a low resistance conductor path, said integrated circuit chip being mounted on a printed circuit board having a conductive track between and connected to first and second separate power supply connection elements each at the same rated chip supply voltage, wherein a standard voltage difference is developed between said power supply connections having the same rated supply voltage when said power supply connections function correctly, and wherein an on-chip test comparison circuit is connected between respective power supply connections by means of respective test leads, said method comprising: detecting, by means of said test comparison circuit, said standard voltage difference between said power supply connections in a test state thereby to indicate correct functioning of the power supply connections, and detecting a critical deviation of a voltage difference across the test leads from said standard voltage difference and generating an error signal to indicate a malfunction of a power supply connection.

6. An electronic apparatus comprising:
a printed circuit board including at least first and second separate power supply connection elements each of which carries the same rated supply voltage whereby a standard voltage appears between said first and second power supply connection elements when said elements function correctly, a conductive track on said printed circuit board between and connected to said first and second power supply connection elements,
an integrated circuit chip mounted on said printed circuit board such that said power supply connection elements provide power supply connections for circuit elements of said integrated circuit chip, said integrated circuit chip further comprising;
a test comparison circuit having first and second input terminals and an output,
first and second test leads connecting said first and second input terminals of the test comparison circuit to said first and second power supply connections, respectively,
said test comparison circuit being responsive, in a test state of the integrated circuit, to a critical deviation of the voltage appearing between said first and second power supply connection elements from said standard voltage for producing an error signal at said output of the test comparison circuit and which is indicative of a malfunction in a power supply connection element.

7. An electronic apparatus as claimed in claim 6, comprising at least said first and second power supply connection elements and a third power supply connection element each of which elements carries said same rated supply voltage, and
a selection mechanism on said integrated circuit chip and coupled to said power supply connection elements and to said input terminals of the test comparison circuit for selectively connecting two of said power supply connection elements at a time to respective ones of said first and second input terminals of the test comparison circuit.

8. An electronic apparatus as claimed in claim 6, wherein said test comparison circuit has a threshold voltage level related to said critical voltage deviation.

9. An electronic apparatus as claimed in claim 6, wherien said power supply connection elements extend into said integrated circuit chip, said integrated circuit chip further comprising a conductive track coupled between said power supply connection elements.

10. An electronic apparatus as claimed in claim 6 further comprising at least third and fourth power supply connection elements each of which carries a same second rated supply voltage, and
means for selectively connecting either said first and second power supply connection elements or said third and fourth power supply connection elements to said first and second input terminals, respectively, of the test comparison circuit during said test state.

11. A method of testing at least three power supply connections having the same rated supply voltage of an integrated circuit chip mounted on a printed circuit board, wherein a standard voltage difference is developed between said power supply connections when said power supply connections function correctly, said method comprising: selectively connecting, via a selection mechanism, respective test leads of an on-chip test comparison circuit to any two of the power supply connections at a time and detecting, by means of said test comparison circuit, said standard voltage difference between said any two of the power supply connections in a test state thereby to indicate correct functioning of the power supply connections, and further detecting a critical deviation of a voltage difference across the test leads from said standard voltage difference and generating an error signal to indicate a malfunction of a power supply connection.

12. An electronic apparatus comprising:
a printed circuit board including at least first and second separate power supply connection pins, each of which carries the same rated supply voltage,
an integrated circuit chip mounted on said printed circuit board and comprising an on-chip test comparison circuit, first and second bi-directional test leads, at least first and second physically separate bidirectional power supply connection elements connected via said first and second bidirectional test leads to respective first and second input terminals of the test comparison circuit and further connected to said first and second power supply connection pins, respectively, such that only bidirectional current paths are present between said first and second power supply connection pins and said first and second input terminals whereby said power supply connection elements each carry said same rated supply voltage and, in a test state, an error signal is produced at a signal output of the test comparison circuit when a voltage deviation from a standard voltage difference across said power supply connection elements exceeds a critical value.

13. An integrated circuit chip comprising:
at least three separate power supply connections which carry the same rated supply voltage, means including a selection mechanism for connecting said power supply connections, via respective test leads, to respective input terminals of an on-chip test comparison circuit in order to produce, in a test state of the integrated circuit, an error signal on a signal output of the test comparison circuit when a voltage deviation from a standard voltage difference across said power supply connections exceeds a critical value, and wherein the selection mechanism is connected between the power supply connections and the test comparison circuit in order to selectively connect only two of said power supply connections at a time to respective input terminals of the test comparison circuit.

14. An integrated circuit as claimed in claim 13 comprising multiple power supply connections for at least two different supply voltages, a further selection mechanism coupled between the supply connections and the test comparison circuit in order to selectively connect in sequence only power supply connections associated with the same supply voltage to respective input terminals of the test comparison circuit.

15. An integrated circuit as claimed in claim 14 wherein at least one selection mechanism comprises a commutation mechanism for inverting the selection of two power supply connections for input terminals of the test comparison circuit.

16. An integrated circuit as claimed in claim 13 wherein the test comparison circuit comprises a discriminator circuit for detecting said critical deviation and an output circuit which is fed thereby in order to form a standard binary representation of the error signal.

17. An integrated circuit as claimed in claim 13 further comprising a data flip-flop which is fed by an output of the test comparison circuit in order to output a result bit for external evaluation by including the flip-flop in a serial shift register.

18. An integrated circuit as claimed in claim 17 further comprising a second data flip-flop for the storage of a control bit for selecting said test leads and for receiving, by including the second data flip-flop in a serial shift register, a control bit from an external control device.

19. An integrated circuit as claimed in claim 18, further comprising a third data flip-flop for storing a second control bit for the selective activation of any power supply connection and for receiving, by including the third data flip-flop in a serial shift register, a further control bit from the external control device.

20. An integrated circuit as claimed in claim 13, comprising: multiple power supply connections for at least two different supply voltages, a further selection mechanism coupled between the supply connections and the test comparison circuit in order to selectively connect each time only power supply connections associated with the same supply voltage to respective input terminals of the test comparison circuit.

21. An integrated circuit chip comprising: at least two separate power supply connections which carry the same rated supply voltage, means connecting said power supply connections, via respective test leads, to respective input terminals of an on-chip test comparison circuit in order to produce, in a test state of the integrated circuit, an error signal on a signal output of the test comparison circuit when a voltage deviation from a standard voltage difference across said power supply connections exceeds a critical value, and wherein said two separate power supply connections are interconnected to multiple circuits on the integrated circuit chip to supply equal voltages to individual ones of said multiple circuits from respective ones of said two separate power supply connections, and wherein, upon an open circuit condition on one of said two separate power supply connections, the other one of said power supply connections applies said rated supply voltage to the one power supply connection and to individual ones of said multiple circuits normally supplied by said one power supply connection such that supply leads from the power supply connections to the multiple circuits are still close to the rated supply voltage, said on-chip test comparison circuit then producing said error signal.

22. An electronic apparatus as claimed in claim 21 wherein said test comparison circuit on the integrated circuit chip is adapted to test for faulty connections on the printed circuit board or between the printed circuit board and the integrated circuit chip.

* * * * *